United States Patent
Lee et al.

(10) Patent No.: US 11,302,558 B2
(45) Date of Patent: Apr. 12, 2022

(54) SUBSTRATE PROCESSING APPARATUS AND SUBSTRATE TRANSFER METHOD

(71) Applicant: PSK INC., Gyeonggi-do (KR)

(72) Inventors: Jong Chan Lee, Gyeonggi-do (KR); Min Ho Choi, Gyeonggi-do (KR); You Jin Choi, Gyeonggi-do (KR); Da In Kim, Gyeonggi-do (KR)

(73) Assignee: PSK INC., Gyeonggi-do (KR)

( * ) Notice: Subject to any disclaimer, the term of this patent is extended or adjusted under 35 U.S.C. 154(b) by 0 days.

(21) Appl. No.: 17/000,726

(22) Filed: Aug. 24, 2020

(65) Prior Publication Data

US 2022/0051922 A1 Feb. 17, 2022

(30) Foreign Application Priority Data

Aug. 14, 2020 (KR) .................. 10-2020-0102224

(51) Int. Cl.
*H01L 21/683* (2006.01)
*H01L 21/66* (2006.01)
*H01L 21/687* (2006.01)

(52) U.S. Cl.
CPC .... *H01L 21/6833* (2013.01); *H01L 21/68707* (2013.01); *H01L 21/68742* (2013.01); *H01L 22/12* (2013.01)

(58) Field of Classification Search
CPC ........... H01L 21/68741; H01L 21/6833; H01L 21/67745; H01L 21/6875; H01L 21/67259
See application file for complete search history.

(56) References Cited

U.S. PATENT DOCUMENTS

| 10,328,465 | B2 * | 6/2019 | Ishii .................. H01L 21/67046 |
| 10,340,175 | B2 * | 7/2019 | Sakaue ................ H01L 21/681 |
| 2003/0139852 | A1 * | 7/2003 | Kataoka ............. H01L 21/6875 700/258 |
| 2005/0034674 | A1 * | 2/2005 | Ono .................... H01L 21/6831 118/728 |

(Continued)

FOREIGN PATENT DOCUMENTS

| JP | H11-195695 A | 7/1999 |
| JP | 2008-41896 A | 2/2008 |

(Continued)

OTHER PUBLICATIONS

Search Report and Written Opinion for related Singapore Patent Application No. 10202008075V dated May 18, 2021 (7 pages).

(Continued)

*Primary Examiner* — Kaitlin S Joerger
(74) *Attorney, Agent, or Firm* — Procopio, Cory, Hargreaves & Savitch LLP

(57) ABSTRACT

An apparatus for processing a substrate includes a housing having a processing space therein, a transfer robot that loads the substrate into the processing space or unloads the substrate from the processing space, a support unit including a chuck that supports the substrate in the processing space and a lift pin that moves the substrate in an up-down direction, a dielectric plate having a lower surface disposed to face an upper surface of the chuck, and a gap measurement unit that measures a gap between the dielectric plate and the substrate supported by the lift pin or a gap between the dielectric plate and the chuck.

16 Claims, 9 Drawing Sheets

(56) References Cited

U.S. PATENT DOCUMENTS

| | | | |
|---|---|---|---|
| 2009/0041568 A1* | 2/2009 | Muraoka | H01L 21/67103 414/586 |
| 2010/0013626 A1* | 1/2010 | Park | C23C 16/52 340/521 |
| 2010/0024723 A1* | 2/2010 | Hasegawa | H01L 21/68 118/500 |
| 2011/0017706 A1* | 1/2011 | Takahashi | H01L 21/68735 216/69 |
| 2011/0049100 A1* | 3/2011 | Han | H01L 21/68785 216/67 |
| 2013/0055952 A1* | 3/2013 | Subramani | C23C 16/481 118/725 |
| 2015/0000056 A1* | 1/2015 | Togawa | H01L 21/68728 15/102 |
| 2015/0294890 A1* | 10/2015 | Hansen | H01L 21/682 414/816 |
| 2018/0016677 A1* | 1/2018 | Roy | H01J 37/32082 |

FOREIGN PATENT DOCUMENTS

| | | |
|---|---|---|
| JP | 2008041896 A | 2/2008 |
| KR | 10-0583418 B1 | 5/2006 |
| KR | 10-2008-0048674 A | 6/2008 |
| KR | 10-2020-0025540 A | 3/2020 |
| KR | 10-2092150 B1 | 3/2020 |
| KR | 10-2116474 B1 | 5/2020 |

OTHER PUBLICATIONS

Search report for related Korean Patent Application No. 10-2020-0102224 dated Aug. 31, 2020, 5 pages.

\* cited by examiner ated on Aug. 14, 2020, in the Korean Intellectual Property Office, the entire contents of which are hereby incorporated by reference.

SUBSTRATE PROCESSING APPARATUS AND SUBSTRATE TRANSFER METHOD

CROSS-REFERENCE TO RELATED APPLICATIONS

A claim for priority under 35 U.S.C. § 119 is made to Korean Patent Application No. 10-2020-0102224 filed on Aug. 14, 2020, in the Korean Intellectual Property Office, the entire contents of which are hereby incorporated by reference.

BACKGROUND

Embodiments of the inventive concept described herein relate to a substrate processing apparatus and a substrate transfer method.

Plasma refers to an ionized gaseous state of matter containing ions, radicals, and electrons and is formed by very high temperature, or by application of a high electric field or an RF electromagnetic field. Semiconductor element manufacturing processes include an ashing or etching process of removing a thin film on a substrate by using plasma. The ashing or etching process is performed by allowing ions and radicals contained in the plasma to collide or react with the thin film on the substrate.

A substrate processing apparatus for processing a substrate using plasma includes a process chamber, a chuck that supports the substrate in the process chamber, lift pins that move the substrate in an up-down direction, and a transfer robot that transfers the substrate into or out of the process chamber. When the transfer robot loads the substrate into the process chamber, the lift pins rise vertically and pick the substrate off the transfer robot. Thereafter, the lift pins lower the substrate onto the chuck. Furthermore, when the transfer robot unloads the substrate from the process chamber, the lift pins raise the substrate off the chuck. Thereafter, the lift pins lower the substrate onto the transfer robot, and the transfer robot unloads the substrate from the process chamber.

However, when the transfer robot transfers a substrate to the lift pins on which another substrate is already placed, a hand of the transfer robot may collide with the substrate placed on the lift pins.

Furthermore, when the transfer robot receives a substrate from the lift pins, the hand of the transfer robot may collide with the lift pins or the substrate placed on the lift pins if the substrate is not raised to an appropriate height (e.g., if the height of the substrate is higher or lower than a set height), or if the substrate is in a state unsuitable to be unloaded (e.g., if the substrate placed on the lift pins is in an inclined state).

SUMMARY

Embodiments of the inventive concept provide a substrate processing apparatus and a substrate transfer method for efficiently transferring a substrate.

Furthermore, embodiments of the inventive concept provide a substrate processing apparatus and a substrate transfer method for minimizing a risk of collision of a hand of a transfer robot with a substrate and/or lift pins in a case of loading the substrate into a housing or unloading the substrate from the housing.

Moreover, embodiments of the inventive concept provide a substrate processing apparatus and a substrate transfer method for determining the position of a substrate in a housing or a presence or absence of the substrate in the housing in a case of loading the substrate into the housing or unloading the substrate from the housing.

In addition, embodiments of the inventive concept provide a substrate processing apparatus and a substrate transfer method for determining whether to load a substrate into a housing or whether to unload the substrate from the housing, based on the position of the substrate in the housing or a presence or absence of the substrate in the housing.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an exemplary embodiment, an apparatus for processing a substrate includes a housing having a processing space therein, a transfer robot that loads the substrate into the processing space or unloads the substrate from the processing space, a support unit including a chuck that supports the substrate in the processing space and a lift pin that moves the substrate in an up-down direction, a dielectric plate having a lower surface disposed to face an upper surface of the chuck, and a gap measurement unit that measures a gap between the dielectric plate and the substrate supported by the lift pin or a gap between the dielectric plate and the chuck.

According to an embodiment, the gap measurement unit may include an irradiation part that irradiates light and a light-receiving part that is disposed on a travel path of the light and that receives the light.

According to an embodiment, the housing may include a pair of view ports that face each other, the irradiation part may be installed on one of the pair of view ports, and the light-receiving part may be installed on the other view port.

According to an embodiment, the gap measurement unit may include a plurality of gap measurement units, and when viewed from above, a travel path of light irradiated by an irradiation part of one of the gap measurement units may be perpendicular to a travel path of light irradiated by an irradiation part of another one of the gap measurement units.

According to an embodiment, the gap measurement unit may measure a gap between an upper surface of the substrate and the lower surface of the dielectric plate when the substrate is placed on the lift pin, and may measure a gap between the upper surface of the chuck and the lower surface of the dielectric plate when the substrate is not placed on the lift pin.

According to an embodiment, the apparatus may further include a controller, and the controller may control the support unit and the gap measurement unit to move the lift pin upward and to measure the gap in a state in which the lift pin is moved upward.

According to an embodiment, the controller may store an upper limit corresponding to a first gap from the lower surface of the dielectric plate and/or a lower limit corresponding to a second gap from the lower surface of the dielectric plate, the second gap being smaller than the first gap, and may determine whether to load the substrate into the processing space or whether to unload the substrate from the processing space, by comparing the measured gap with the upper limit and/or the lower limit.

According to an embodiment, the controller may compare the gap and the upper limit when loading the substrate into the processing space and may control the transfer robot to load the substrate into the processing space when the gap is greater than the upper limit.

According to an embodiment, the controller may compare the gap and the upper limit when loading the substrate into the processing space and may control the apparatus to generate an interlock when the gap is smaller than the upper limit.

According to an embodiment, the controller may compare the gap with the upper limit and the lower limit when unloading the substrate from the processing space and may control the transfer robot to unload the substrate from the processing space when the gap is smaller than the upper limit and greater than the lower limit.

According to an embodiment, the controller may compare the gap with the upper limit and the lower limit when unloading the substrate from the processing space and may control the apparatus to generate an interlock when the gap is greater than the upper limit or smaller than the lower limit.

According to an exemplary embodiment, a method for transferring a substrate using the apparatus includes moving the lift pin upward, measuring the gap in a state in which the lift pin is moved upward, and determining whether to load the substrate into the processing space or whether to unload the substrate from the processing space, based on the measured gap.

According to an embodiment, whether to load the substrate into the processing space or whether to unload the substrate from the processing space may be determined by comparing the measured gap with an upper limit corresponding to a first gap from the lower surface of the dielectric plate and a lower limit corresponding to a second gap from the lower surface of the dielectric plate, the second gap being smaller than the first gap.

According to an embodiment, the gap and the upper limit may be compared with each other when the substrate is loaded into the processing space, and the substrate may be loaded into the processing space when the gap is greater than the upper limit.

According to an embodiment, the gap and the upper limit may be compared with each other when the substrate is loaded into the processing space, and an interlock may be generated when the gap is smaller than the upper limit.

According to an embodiment, the gap may be compared with the upper limit and the lower limit when the substrate is unloaded from the processing space, and the substrate may be unloaded from the processing space when the gap is smaller than the upper limit and greater than the lower limit.

According to an embodiment, the gap may be compared with the upper limit and the lower limit when the substrate is unloaded from the processing space, and an interlock may be generated when the gap is greater than the upper limit and smaller than the lower limit.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
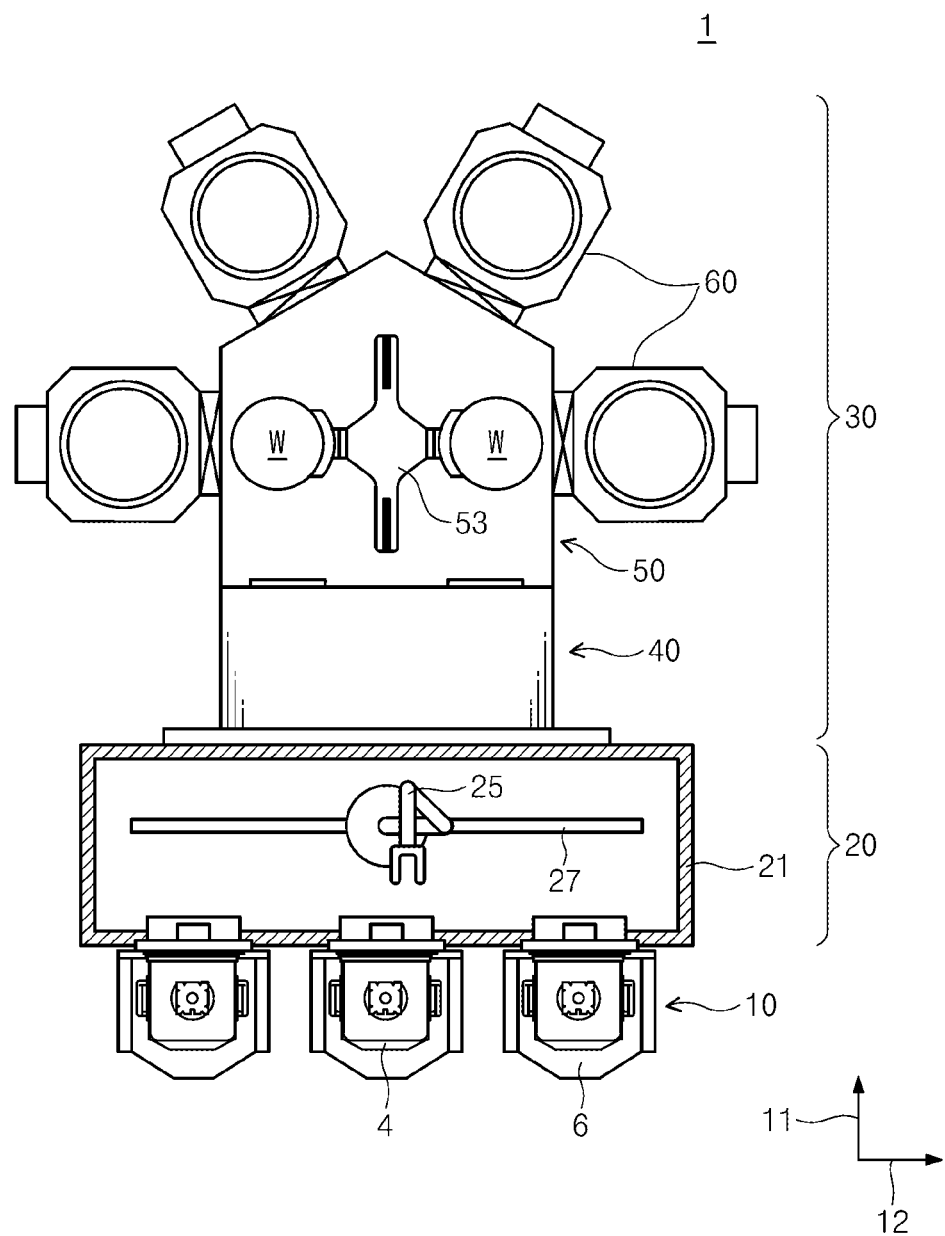
FIG. 1 is a schematic view illustrating substrate processing equipment according to an embodiment of the inventive concept.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Hereinafter, embodiments of the inventive concept will be described in detail with reference to FIGS. 1 to 9.

FIG. 1 is a schematic view illustrating substrate processing equipment according to an embodiment of the inventive concept. Referring to FIG. 1, the substrate processing equipment 1 includes an equipment front end module (EFEM) 20 and a processing module 30. The equipment front end module 20 and the processing module 30 are disposed in one direction.

The equipment front end module 20 includes a load port 10 and a transfer frame 21. The load port 10 is disposed at the front of the equipment front end module 20 in a first direction 11. The load port 10 includes a plurality of supports 6. The supports 6 are disposed in a row in a second direction 12, and carriers 4 (e.g., cassettes, FOUPs, or the like) in which substrates W to be processed and substrates W completely processed are received are seated on the supports 6. The substrates W to be processed and the substrates W completely processed are received in the carriers 4. The transfer frame 21 is disposed between the load port 10 and the processing module 30. The transfer frame 21 includes a first transfer robot 25 that is disposed in the transfer frame 21 and that transfers the substrates W between the load port 10 and the processing module 30. The first transfer robot 25 moves along a transfer rail 27 in the second direction 12 and transfers the substrates W between the carriers 4 and the processing module 30.

The processing module 30 includes a load-lock chamber 40, a transfer chamber 50, and process chambers 60. The processing module 30 may process the substrates W transferred from the equipment front end module 20.

The load-lock chamber 40 is disposed adjacent to the transfer frame 21. For example, the load-lock chamber 40 may be disposed between the transfer chamber 50 and the equipment front end module 20. The load-lock chamber 40 provides a space in which the substrates W to be processed stand by before transferred to the process chambers 60 or a space in which the substrates W completely processed stand by before transferred to the equipment front end module 20.

The transfer chamber 50 may transfer the substrates W. The transfer chamber 50 is disposed adjacent to the load-lock chamber 40. The transfer chamber 50 has a polygonal body when viewed from above. Referring to FIG. 1, the transfer chamber 50 has a pentagonal body when viewed from above. On the outside of the body, the load-lock chamber 40 and the plurality of process chambers 60 are disposed along the periphery of the body. The body has, in sidewalls thereof, passages (not illustrated) through which the substrates W enter or exit the transfer chamber 50, and the passages connect the transfer chamber 50 and the load-lock chamber 40 or the process chambers 60. Doors (not illustrated) are provided for the respective passages to open/close the passages and hermetically seal the interior of the transfer chamber 50. A second transfer robot 53 is disposed in the interior space of the transfer chamber 50 and transfers the substrates W between the load-lock chamber 40 and the process chambers 60. The second transfer robot 53 transfers unprocessed substrates W standing by in the load-lock chamber 40 to the process chambers 60, or transfers completely processed substrates W to the load-lock chamber 40. Furthermore, the second transfer robot 53 may load a substrate W into a processing space 102 of a housing 100 that will be described below, or may unload the substrate W from the processing space 102. In addition, the second transfer robot 53 may transfer a substrate W between the process chambers 60 to sequentially provide the substrate W to the plurality of process chambers 60. As illustrated in FIG. 1, when the transfer chamber 50 has the pentagonal body, the load-lock chamber 40 is disposed on the sidewall of the transfer chamber 50 that is adjacent to the equipment front end module 20, and the process chambers 60 are continuously disposed on the remaining sidewalls of the transfer chamber 50. The transfer chamber 50 may have various shapes depending on required process modules, as well as the aforementioned shape.

The process chambers 60 may be disposed adjacent to the transfer chamber 50. The process chambers 60 are disposed around the transfer chamber 50. The plurality of process chambers 60 may be provided. In the process chambers 60, a process may be performed on a substrate W. The process chambers 60 process the substrate W transferred from the second transfer robot 53 and provide the completely processed substrate W to the second transfer robot 53. The processes performed in the respective process chambers 60 may differ from one another.

Hereinafter, among the process chambers 60, a substrate processing apparatus 1000 for performing a plasma process will be described in detail. The substrate processing apparatus 1000 is exemplified by a process chamber configured to perform a plasma processing process on an edge region of a substrate, among the process chambers 60. Without being limited thereto, however, the substrate processing apparatus 1000 may be identically or similarly applied to various chambers in which a substrate is processed. Furthermore, the substrate processing apparatus 1000 may be identically or similarly applied to various chambers in which a plasma processing process is performed on a substrate.

Figure 2:
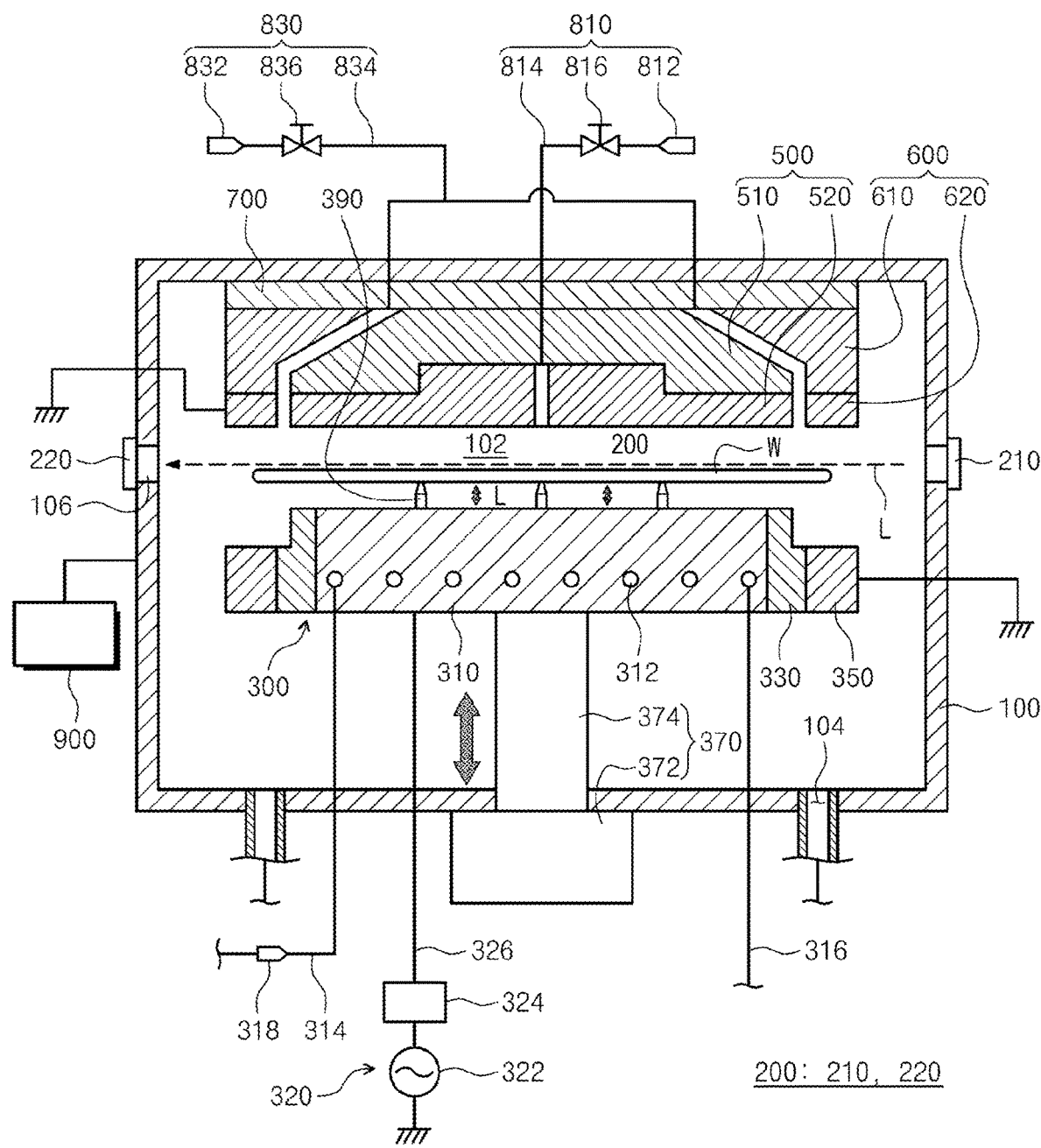
FIG. 2 is a view illustrating one embodiment of a substrate processing apparatus provided in a process chamber of FIG. 1.

FIG. 2 is a view illustrating one embodiment of the substrate processing apparatus provided in the process chamber of FIG. 1. Referring to FIG. 2, the substrate processing apparatus 1000 provided in the process chamber 60 performs a predetermined process on a substrate W by using plasma. For example, the substrate processing apparatus 1000 may etch or strip a thin film on the substrate W. The thin film may be various types of films such as a poly silicon film, a silicon oxide film, a silicon nitride film, and the like. Alternatively, the thin film may be a native oxide film or a chemically formed oxide film. In another case, the thin film may be a by-product generated in a process of processing the substrate W. In another case, the thin film may be an impurity adhering to and/or remaining on the substrate W.

The substrate processing apparatus 1000 may perform a plasma process on the substrate W. For example, the substrate processing apparatus 1000 may process the substrate W by supplying a process gas and generating plasma from the supplied process gas. The substrate processing apparatus 1000 may process an edge region of the substrate W by supplying the process gas and generating plasma from the supplied process gas. Hereinafter, the substrate processing apparatus 1000 is exemplified by a bevel etching apparatus that performs an etching process on the edge region of the substrate W.

The substrate processing apparatus 1000 may include the housing 100, a gap measurement unit 200, a support unit 300, a dielectric plate unit 500, an upper electrode unit 600, a temperature adjustment plate 700, a gas supply unit 800, and a controller 900.

The housing 100 may have a processing space 102 therein. The housing 100 may have an opening (not illustrated) that is formed in a sidewall thereof. The substrate W may be loaded into or unloaded from the processing space 102 of the housing 100 through the opening formed in the sidewall of the housing 100. The opening may be opened and closed by an opening/closing member such as a door (not illustrated). When the opening of the housing 100 is closed by the opening/closing member, the processing space 102 of the housing 100 may be isolated from the outside. An atmosphere in the processing space 102 of the housing 100 may be adjusted to a low pressure close to vacuum pressure after the processing space 102 of the housing 100 is isolated from the outside. The housing 100 may be formed of a material containing metal. Furthermore, the housing 100 may be coated with an insulating material.

The housing 100 may be a vacuum chamber. For example, the housing 100 may have exhaust holes 104 formed in the bottom thereof. Plasma P generated in the processing space 102 or gases G1 and G2 supplied into the processing space 102 may be released to the outside through the exhaust holes 104. Furthermore, by-products generated in a process of processing the substrate W using the plasma P may be released to the outside through the exhaust holes 104. The exhaust holes 104 may be connected with exhaust lines (not illustrated). The exhaust lines may be connected with a pressure-reducing member that applies reduced pressure. The pressure-reducing member may apply the reduced pressure to the processing space 102 through the exhaust lines.

The housing 100 may include a view port 106. The view port 106 may be formed of a transparent material. The view port 106 may be a port through which an operator identifies the processing space 102 of the housing 100 with the naked eyes, or a port through which light L irradiated by an irradiation part 210 transmits. The view port 106 may be provided in the sidewall of the housing 100. A pair of view ports 106 may be provided to face each other. The view ports 106 may be provided below a lower surface of a dielectric plate 520 and above an upper surface of a chuck 310.

The gap measurement unit 200 may measure the gap between the dielectric plate 520 and the substrate W. Furthermore, the gap measurement unit 200 may measure the gap between the dielectric plate 520 and the chuck 310. For example, the gap measurement unit 200 may measure the gap between the lower surface of the dielectric plate 520 and an upper surface of the substrate W. In addition, the gap measurement unit 200 may measure the gap between the lower surface of the dielectric plate 520 and the upper surface of the chuck 310.

In a case where the substrate W is placed on lift pins 390 that will be described below, the gap measurement unit 200 may measure the gap between the upper surface of the substrate W placed on the lift pins 390 and the lower surface of the dielectric plate 520. In a case where the substrate W is not placed on the lift pins 390, the gap measurement unit 200 may measure the gap between the upper surface of the chuck 310 and the lower surface of the dielectric plate 520. The gap measurement unit 200 may be a gap sensor. For example, the gap measurement unit 200 may be a gap sensor that measures a gap using light of an LED.

The gap measurement unit 200 may include the irradiation part 210 and a light-receiving part 220. The irradiation part 210 may irradiate the light L. The light-receiving part 220 may receive the light L irradiated by the irradiation part 210. The light-receiving part 220 may be disposed on a travel path of the light L irradiated by the irradiation part 210. The irradiation part 210 and the light-receiving part 220 may be installed on the view ports 106 described above. For example, the irradiation part 210 may be installed on one of the pair of view ports 106, and the light-receiving part 220 may be installed on the other view port 106. That is, the light L irradiated into the processing space 102 through one of the pair of view ports 106 by the irradiation part 210 may be transferred to the light-receiving part 220 through the other view port 106.

The support unit 300 may support the substrate W in the processing space 102. The support unit 300 may include the chuck 310, a power supply member 320, an insulating ring 330, a lower electrode 350, a drive member 370, and the lift pins 390.

The chuck 310 may support the substrate W in the processing space 102. The chuck 310 may have a support surface that supports the substrate W. The chuck 310 may have a circular shape when viewed from above. The chuck 310, when viewed from above, may have a smaller diameter than the substrate W. Accordingly, a central region of the substrate W supported by the chuck 310 may be seated on the support surface of the chuck 310, and the edge region of the substrate W may not make contact with the support surface of the chuck 310.

A heating unit (not illustrated) may be provided inside the chuck 310. The heating unit (not illustrated) may heat the chuck 310. The heating unit (not illustrated) may be a heater. Furthermore, the chuck 310 may have a cooling channel 312. The cooling channel 312 may be formed inside the chuck 310. A coolant supply line 314 and a coolant discharge line 316 may be connected to the cooling channel 312. The coolant supply line 314 may be connected with a coolant supply source 318. The coolant supply source 318 may store a coolant and/or may supply the coolant to the coolant supply line 314. The coolant supplied to the cooling channel 312 may be released to the outside through the coolant discharge line 316. The coolant stored and/or supplied by the coolant supply source 318 may be cooling water or cooling gas. The shape of the cooling channel 312 formed inside the chuck 310 is not limited to the shape illustrated in FIG. 3, and various modifications and changes may be made to the shape of the cooling channel 312. Furthermore, a configuration for cooling the chuck 310 is not limited to the configuration for supplying the coolant and may be implemented with various configurations (e.g., a cooling plate) capable of cooling the chuck 310.

The power supply member 320 may supply electric power to the chuck 310. The power supply member 320 may include a power supply 322, a matcher 324, and a power line 326. The power supply 322 may be a bias supply. Alternatively, the power supply 332 may be an RF power supply. The power supply 322 may be connected with the chuck 310 through the power line 326. The matcher 324 may be provided on the power line 326 and may perform impedance matching.

The insulating ring 330 may have a ring shape when viewed from above. The insulating ring 330 may surround the chuck 310 when viewed from above. For example, the insulating ring 330 may have a ring shape. The insulating ring 330 may have a step such that the height of an upper surface of an inner region differs from the height of an upper surface of an outer region. For example, the upper surface of the inner region of the insulating ring 330 may be in a higher position than the upper surface of the outer region of the insulating ring 330. When the substrate W is seated on the support surface of the chuck 310, the upper surface of the inner region of the insulating ring 330 may be brought into contact with a bottom surface of the substrate W. Furthermore, when the substrate W is seated on the support surface of the chuck 310, the upper surface of the outer region of the insulating ring 330 may be spaced apart from the bottom surface of the substrate W. The insulating ring 330 may be provided between the chuck 310 and the lower electrode 350 that will be described below. Because bias power is supplied to the chuck 310, the insulating ring 330 may be provided between the chuck 310 and the lower electrode 350. The insulating ring 330 may be formed of an insulating material.

The lower electrode 350 may be disposed under the edge region of the substrate W supported by the chuck 310. The lower electrode 350 may have a ring shape when viewed from above. The lower electrode 350 may surround the insulating ring 330 when viewed from above. An upper surface of the lower electrode 350 may be provided at the same height as the upper surface of the outer region of the insulating ring 330. A lower surface of the lower electrode 350 may be provided at the same height as a lower surface of the insulating ring 330. Furthermore, the upper surface of the lower electrode 350 may be provided in a lower position than an upper surface of a central portion of the chuck 310. In addition, the lower electrode 350 may be spaced apart from the bottom surface of the substrate W supported by the chuck 310. For example, the lower electrode 350 may be spaced apart from a bottom surface of the edge region of the substrate W supported by the chuck 310.

The lower electrode 350 may be disposed to face an upper electrode 620 that will be described below. The lower electrode 350 may be disposed under the upper electrode 620. The lower electrode 350 may be grounded. The lower electrode 350 may increase plasma density by inducing a coupling of bias power applied to the chuck 310. Accordingly, processing efficiency for the edge region of the substrate W may be improved.

The drive member 370 may raise and lower the chuck 310. The drive member 370 may include an actuator 372 and a shaft 374. The shaft 374 may be combined with the chuck 310. The shaft 374 may be connected with the actuator 372. The actuator 372 may move the chuck 310 upward and downward through the shaft 374.

The lift pins 390 may move the substrate W upward and downward. The lift pins 390 may be moved upward and downward by a separate actuator (not illustrated). The lift pins 390 may be moved upward and downward through pin holes (not illustrated) that are formed in the chuck 310. The plurality of lift pins 390 may be provided. For example, the plurality of lift pins 390 may support the lower surface of the substrate W in different positions and may raise and lower the substrate W.

The dielectric plate unit 500 may include the dielectric plate 520 and a first base 510. The dielectric plate unit 500 may be combined with the temperature adjustment plate 700 that will be described below.

The dielectric plate 520 may be disposed such that the lower surface thereof faces the upper surface of the chuck 310. The dielectric plate 520 may have a circular shape when viewed from above. An upper surface of the dielectric plate 520 may have a step such that a central region is in a higher position than an edge region. The lower surface of the dielectric plate 520 may be provided in a flat shape. The dielectric plate 520 may be disposed to face the substrate W supported on the support unit 300 in the processing space 102. The dielectric plate 520 may be disposed over the support unit 300. The dielectric plate 520 may be formed of a material containing ceramic. A gas channel connected with a first gas supply unit 810 of the gas supply unit 800 that will be described below may be formed inside the dielectric plate 520. A dispensing end of the gas channel may be configured such that the first gas G1 supplied by the first gas supply unit 810 is supplied to the central region of the substrate W supported on the support unit 300. Furthermore, the dispensing end of the gas channel may be configured such that the first gas G1 is supplied to an upper surface of the central region of the substrate W supported on the support unit 300.

The first base 510 may be disposed between the dielectric plate 520 and the temperature adjustment plate 700. The first base 510 may be combined with the temperature adjustment plate 700, and the dielectric plate 520 may be combined with the first base 510. Accordingly, the dielectric plate 520 may be combined with the temperature adjustment plate 700 through the first base 510.

The diameter of the first base 510 may gradually increase from top to bottom. An upper surface of the first base 510 may have a smaller diameter than the lower surface of the dielectric plate 520. The upper surface of the first base 510 may have a flat shape. A lower surface of the first base 510 may have a stepped shape. For example, the lower surface of the first base 510 may have a step such that an edge region is in a lower position than a central region. The lower surface of the first base 510 and the upper surface of the dielectric plate 520 may have interlocking shapes. For example, the central region of the dielectric plate 520 may be inserted into the central region of the first base 510. The first base 510 may be formed of a material containing metal. For example, the first base 510 may be formed of a material containing aluminum.

The upper electrode unit 600 may include a second base 610 and the upper electrode 620. The upper electrode unit 600 may be combined with the temperature adjustment plate 700.

The upper electrode 620 may face the above-described lower electrode 350. The upper electrode 620 may be disposed over the lower electrode 350. The upper electrode 620 may be disposed over the edge region of the substrate W supported by the chuck 310. The upper electrode 620 may be grounded.

The upper electrode 620, when viewed from above, may have a shape surrounding the dielectric plate 520. The upper electrode 620 may be spaced apart from the dielectric plate 520. The upper electrode 620, together with the dielectric plate 520, may form a spacing space therebetween. The spacing space may form part of a gas channel through which the second gas G2 supplied by a second gas supply unit 830 flows. A dispensing end of the gas channel may be configured such that the second gas G2 is supplied to the edge region of the substrate W supported on the support unit 300. Furthermore, the dispensing end of the gas channel may be configured such that the second gas G2 is supplied to an upper surface of the edge region of the substrate W supported on the support unit 300.

The second base 610 may be disposed between the upper electrode 620 and the temperature adjustment plate 700. The second base 610 may be combined with the temperature adjustment plate 700, and the upper electrode 620 may be combined with the second base 610. Accordingly, the upper electrode 620 may be combined with the temperature adjustment plate 700 through the second base 610.

The second base 610 may have a ring shape when viewed from above. An upper surface and a lower surface of the second base 610 may have a flat shape. When viewed from above, the second base 610 may have a shape surrounding the first base 510. The inner diameter of the second base 610 may gradually increase from top to bottom. The second base 610 may be spaced apart from the first base 510. The second base 610, together with the first base 510, may form a spacing space therebetween. The spacing space may form part of the gas channel through which the second gas G2 supplied by the second gas supply unit 830 flows. The second base 610 may be formed of a material containing metal. For example, the second base 610 may be formed of a material containing aluminum.

The temperature adjustment plate 700 may be combined with the dielectric plate unit 500 and the upper electrode unit 600. The temperature adjustment plate 700 may be attached to the housing 100. The temperature adjustment plate 700 may generate heat. For example, the temperature adjustment plate 700 may generate warm-heat or cold-heat. The temperature adjustment plate 700 may receive a signal from the controller 900 and may generate heat. By generating warm-heat or cold-heat, the temperature adjustment plate 700 may control such that the temperatures of the dielectric plate unit 500 and the upper electrode unit 600 remain comparatively constant. For example, by generating cold-heat, the temperature adjustment plate 700 may maximally suppress an excessive rise in temperatures of the dielectric plate unit 500 and the upper electrode unit 600 in a process of processing the substrate W.

The gas supply unit 800 may supply gas into the processing space 102. The gas supply unit 800 may supply the first gas G1 and the second gas G2 into the processing space 102. The gas supply unit 800 may include the first gas supply unit 810 and the second gas supply unit 830.

The first gas supply unit 810 may supply the first gas G1 into the processing space 102. The first gas G1 may be an inert gas such as nitrogen. The first gas supply unit 810 may supply the first gas G1 to the central region of the substrate W supported by the chuck 310. The first gas supply unit 810 may include a first gas supply source 812, a first gas supply line 814, and a first valve 816. The first gas supply source 812 may store the first gas G1 and/or may supply the first gas G1 to the first gas supply line 814. The first gas supply line 814 may be connected with the gas channel formed inside the dielectric plate 520. The first valve 816 may be provided in the first gas supply line 814. The first valve 816 may be an On/Off valve or a flow-rate control valve. The first gas G1 supplied by the first gas supply source 812 may be supplied to the upper surface of the central region of the substrate W through the gas channel formed inside the dielectric plate 520.

The second gas supply unit 830 may supply the second gas G2 into the processing space 102. The second gas G2 may be a process gas that is excited into plasma. The second gas supply unit 830 may supply the second gas G2 to the edge region of the substrate W through the gas channel that is formed by the dielectric plate 520, the first base 510, the upper electrode 620, and the second base 610 that are provided over the edge region of the substrate W supported by the chuck 310. The second gas supply unit 830 may include a second gas supply source 832, a second gas supply line 834, and a second valve 836. The second gas supply source 832 may store the second gas G2 and/or may supply the second gas G2 to the second gas supply line 834. The second gas supply line 834 may supply the second gas G2 into the spacing spaces that function as the gas channel. The second valve 836 may be provided in the second gas supply line 834. The second valve 836 may be an On/Off valve or a flow-rate control valve. The second gas G2 supplied by the second gas supply source 832 may be supplied to the upper surface of the edge region of the substrate W through the gas channel that is formed by the dielectric plate 520, the first base 510, the upper electrode 620, and the second base 610.

The controller 900 may control the substrate processing apparatus 1000. The controller 900 may control the substrate processing apparatus 1000 to perform a plasma processing process. For example, the controller 900 may control the gas supply unit 800, the temperature adjustment plate 700, and the support unit 300. For example, the controller 900 may control the support unit 300 and the gas supply unit 800 such that when the first gas supply unit 810 and/or the second gas supply unit 830 supplies gas, the power supply 322 applies electric power to the chuck 310 to generate plasma P over the edge region of the substrate W supported by the chuck 310.

Figure 3:
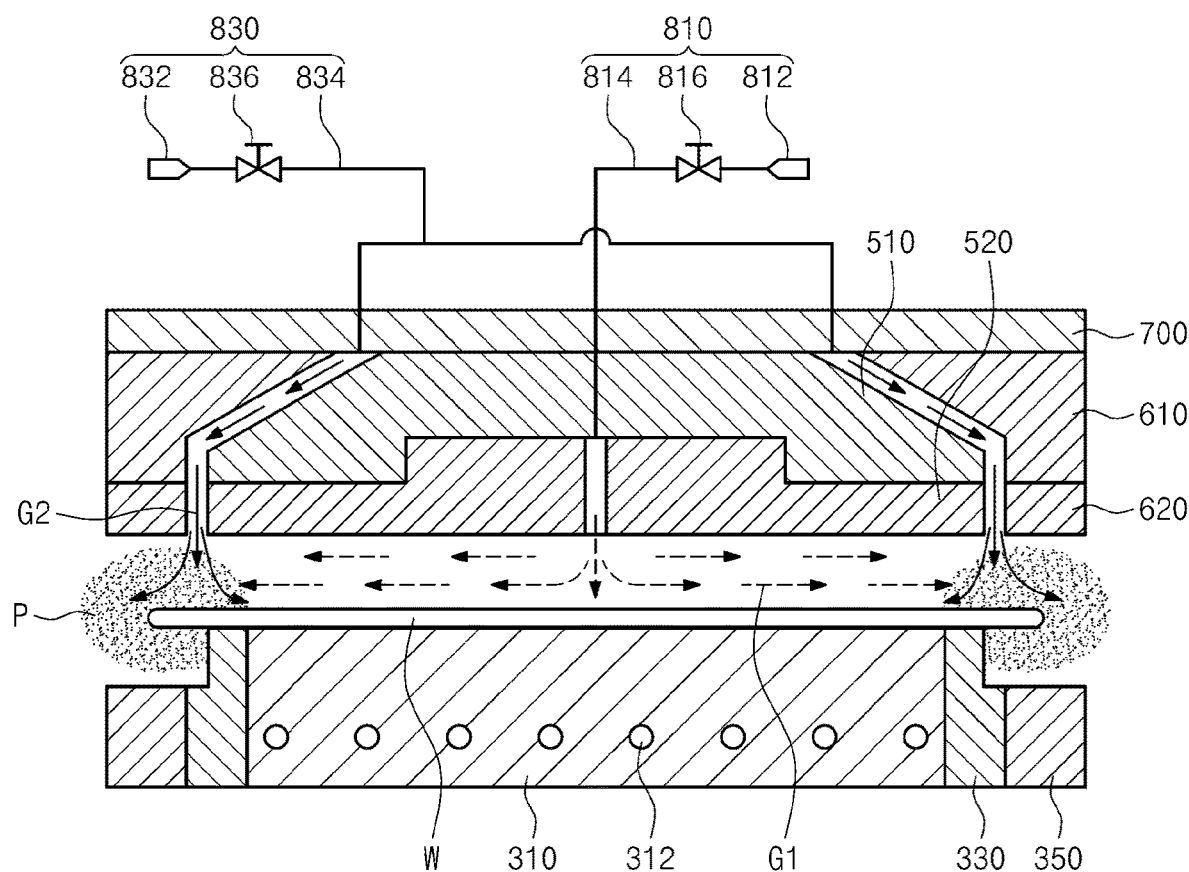
FIG. 3 is a view illustrating one embodiment in which the substrate processing apparatus of FIG. 2 performs a plasma processing process.

FIG. 3 is a view illustrating one embodiment in which the substrate processing apparatus of FIG. 2 performs a plasma processing process. Referring to FIG. 3, the substrate processing apparatus 1000 according to the embodiment of the inventive concept may process the edge region of the substrate W. For example, the substrate processing apparatus 1000 may process the edge region of the substrate W by generating plasma P over the edge region of the substrate W.

For example, the substrate processing apparatus 1000 may perform a bevel etching process of processing the edge region of the substrate W. When the substrate processing apparatus 1000 processes the edge region of the substrate W, the first gas supply unit 810 may supply the first gas G1 to the central region of the substrate W, and the second gas supply unit 830 may supply the second gas G2 to the edge region of the substrate W. Because the second gas G2 supplied by the second gas supply unit 830 is a process gas, the second gas G2 may be excited into plasma P to process the edge region of the substrate W. For example, a thin film on the edge region of the substrate W may be etched by the plasma P. The first gas G1 supplied to the central region of the substrate W is an inert gas. The first gas G1 prevents the second gas G2 from being introduced into the central region of the substrate W, thereby improving processing efficiency for the edge region of the substrate W. The temperature adjustment plate 700 may generate cold-heat to suppress an excessive rise in the temperatures of the dielectric plate unit 500 and the upper electrode unit 600 while the substrate W is processed.

According to an embodiment of the inventive concept, the first base 510 is disposed between the dielectric plate 520 and the temperature adjustment plate 700. The first base 510 may be formed of a material different from that of the dielectric plate 520 and may be formed of a material the same as that of the temperature adjustment plate 700. That is, the coefficient of thermal expansion of the first base 510 may be closer to the coefficient of thermal expansion of the temperature adjustment plate 700 than the coefficient of thermal expansion of the dielectric plate 520. The first base 510 is disposed between the dielectric plate 520 and the temperature adjustment plate 700, and distortion between the temperature adjustment plate 700 and the dielectric plate 520 may be minimized by cold-heat generated by the temperature adjustment plate 700. This is because the first base 510 making direct contact with the temperature adjustment plate 700 is formed of a material similar to that of the temperature adjustment plate 700.

Similarly, according to an embodiment of the inventive concept, the second base 610 is disposed between the upper electrode 620 and the temperature adjustment plate 700. The second base 610 may be formed of a material different from that of the upper electrode 620 and may be formed of a material the same as that of the temperature adjustment plate 700. That is, the coefficient of thermal expansion of the second base 610 may be closer to the coefficient of thermal expansion of the temperature adjustment plate 700 than the coefficient of thermal expansion of the upper electrode 620. The second base 610 is disposed between the upper electrode 620 and the temperature adjustment plate 700, and distortion between the temperature adjustment plate 700 and the dielectric plate 620 may be minimized by cold-heat generated by the temperature adjustment plate 700. This is because the second base 610 making direct contact with the temperature adjustment plate 700 is formed of a material similar to that of the temperature adjustment plate 700.

Hereinafter, a substrate transfer method of the inventive concept will be described. To perform the substrate transfer method, the controller 900 may control the substrate processing apparatus 1000. For example, to perform the substrate transfer method, the controller 900 may control the gap measurement unit 200, the support unit 300, and the second transfer robot 53.

Figure 4:
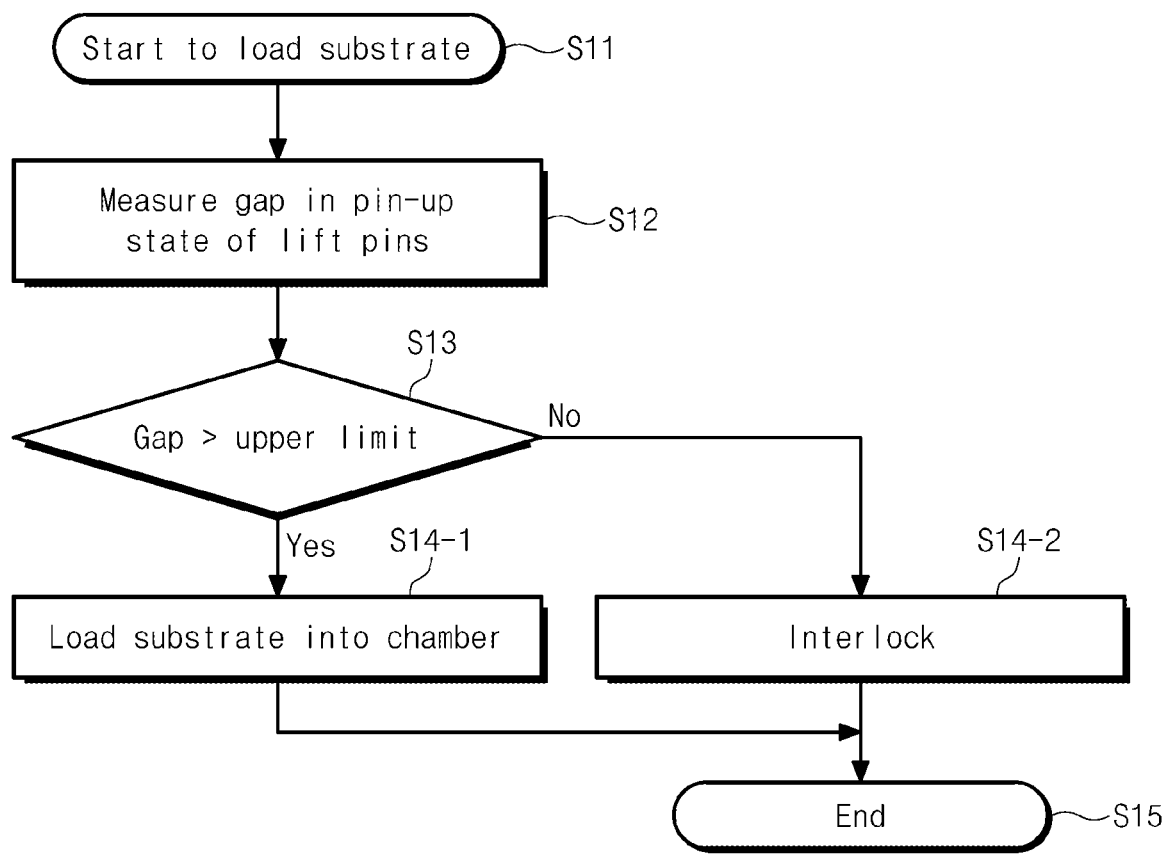
FIG. 4 is a flowchart illustrating a substrate transfer method according to an embodiment of the inventive concept.

FIG. 4 is a flowchart illustrating a substrate transfer method according to an embodiment of the inventive concept. For example, FIG. 4 illustrates a transfer sequence in a case of loading the substrate W into the processing space 102 of the housing 100. Referring to FIG. 4, when the substrate W starts to be loaded into the processing space 102 of the housing 100 (S11), the support unit 300 may move the lift pins 390 upward. The gap measurement unit 200 may measure a gap D in the pin-up state of the lift pins 390 (S12). As described above, in a case where the substrate W is placed on the lift pins 390, the gap measurement unit 200 measures the gap D between the upper surface of the substrate W placed on the lift pins 390 and the dielectric plate 520. Furthermore, in a case where the substrate W is not placed on the lift pins 390, the gap measurement unit 200 measures the gap between the upper surface of the chuck 310 and the lower surface of the dielectric plate 520. The gap measurement unit 200 may transfer a numerical value for the measured gap D to the controller 900.

The controller 900 may store an upper limit (UL) and a lower limit (LL). The upper limit (UL) may be a first gap from the lower surface of the dielectric plate 520. The lower limit (LL) may be a second gap from the lower surface of the dielectric plate 520. The second gap may be smaller than the first gap.

The controller 900 may compare the gap D, which is transferred from the gap measurement unit 200, with the upper limit (UL) or the lower limit (LL) and may determine whether the substrate W is placed on the lift pins 390 or whether the substrate W is present in the processing space 102, thereby determining whether to load the substrate W into the processing space 102 (S13).

Figure 5:
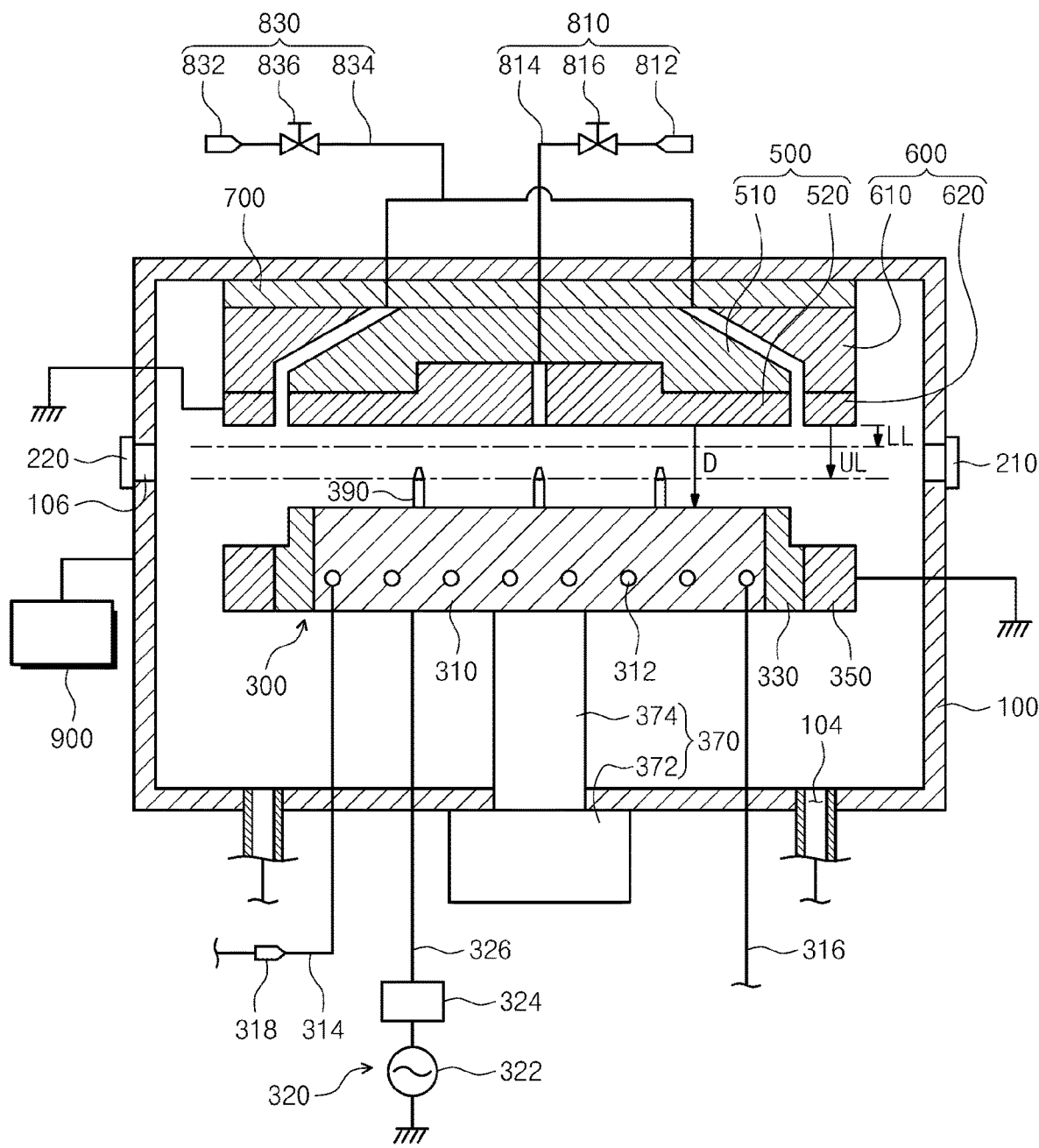
FIG. 5 is a view illustrating the substrate processing apparatus when a gap measured by a gap measurement unit is greater than an upper limit.

For example, in a case where the substrate W is not placed on the lift pins 390 as illustrated in FIG. 5, the gap D measured by the gap measurement unit 200 may correspond to the gap between the lower surface of the dielectric plate 520 and the upper surface of the chuck 310. The gap D measured by the gap measurement unit 200 may be greater than the upper limit (UL). In this case, the controller 900 may determine that the substrate W is not placed on the lift pins 390 or may determine that the substrate W is not present in the processing space 102, and the second transfer robot 53 may load the substrate W into the processing space 102 (S14-1).

Figure 6:
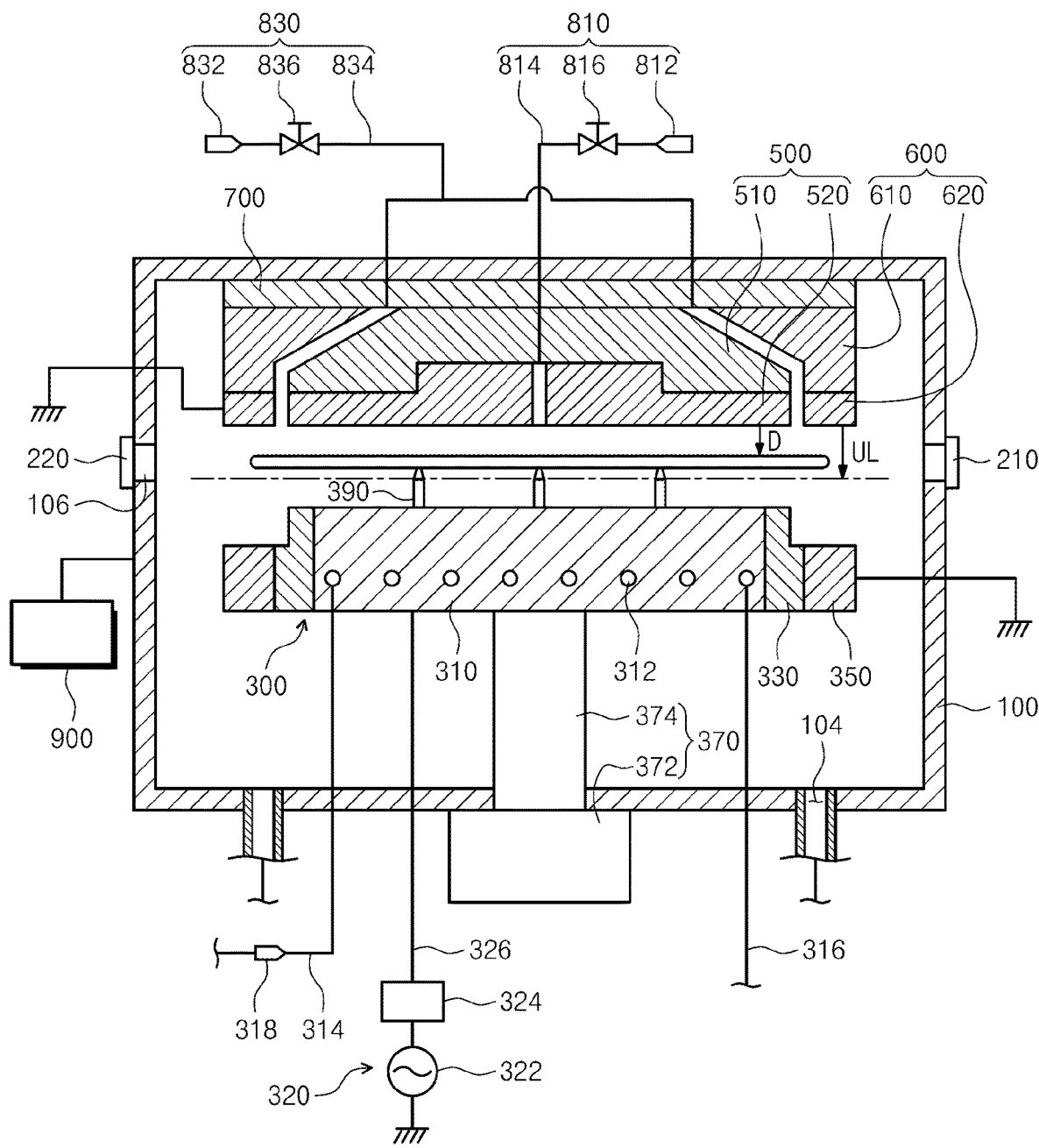
FIG. 6 is a view illustrating the substrate processing apparatus when a gap measured by the gap measurement unit is smaller than the upper limit.

In contrast, in a case where the substrate W is placed on the lift pins 390 as illustrated in FIG. 6, the gap D measured by the gap measurement unit 200 may correspond to the gap between the lower surface of the dielectric plate 520 and the upper surface of the substrate W placed on the lift pins 390. The gap D measured by the gap measurement unit 200 may be smaller than the upper limit (UL). In this case, the controller 390 may determine that the substrate W is placed on the lift pins 390 or may determine that the substrate W is present in the processing space 102. In this case, the controller 900 determines that the substrate loading sequence operates despite the existence of the substrate W in the processing space 102, and the controller 900 controls the substrate processing apparatus 1000 to generate an interlock and stop the operation of the substrate processing apparatus 1000 (S14-2).

Thereafter, when the substrate W is completely unloaded from the processing space 102 or an interlock is generated, the controller 900 may end the substrate transfer sequence (S15).

Figure 7:
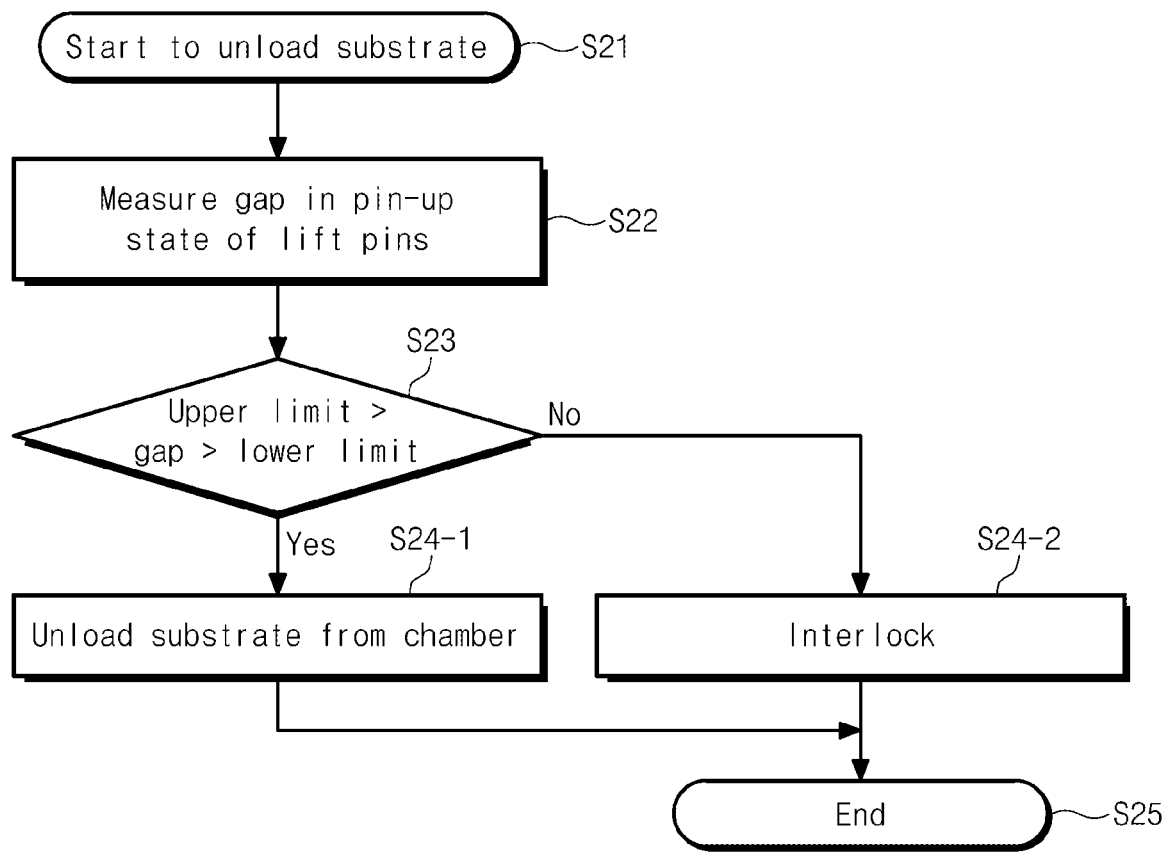
FIG. 7 is a flowchart illustrating a substrate transfer method according to another embodiment of the inventive concept.

FIG. 7 is a flowchart illustrating a substrate transfer method according to another embodiment of the inventive concept. For example, FIG. 7 illustrates a transfer sequence in a case of unloading the substrate W from the processing space 102 of the housing 100. Referring to FIG. 7, when the substrate W starts to be unloaded from the processing space 102 of the housing 100 (S21), the support unit 300 may move the lift pins 390 upward. The gap measurement unit 200 may measure a gap D in the pin-up state of the lift pins 390 (S22). As described above, in a case where the substrate W is placed on the lift pins 390, the gap measurement unit 200 measures the gap D between the upper surface of the substrate W placed on the lift pins 390 and the dielectric plate 520. The gap measurement unit 200 may transfer a numerical value for the measured gap D to the controller 900.

The controller 900 may compare the gap D, which is transferred from the gap measurement unit 200, with the upper limit (UL) or the lower limit (LL) and may determine whether the substrate W is in a state suitable to be unloaded by the second transfer robot 53 (S23).

Figure 8:
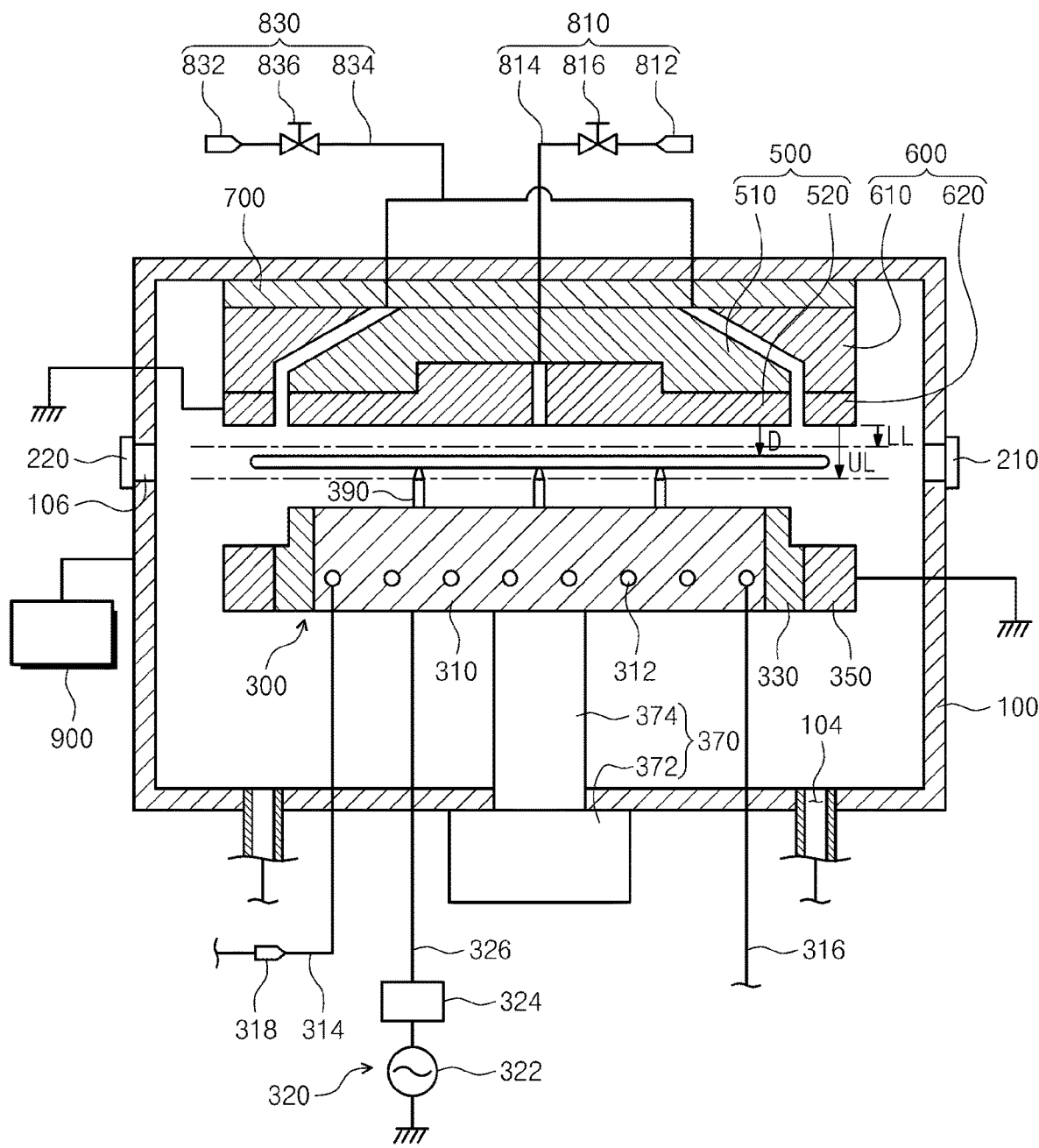
FIG. 8 is a view illustrating the substrate processing apparatus when a substrate placed on lift pins is raised to a height suitable to be unloaded from a housing.

For example, in a case where the substrate W is in a state suitable to be unloaded by the second transfer robot 53 as illustrated in FIG. 8, the gap D measured by the gap measurement unit 200 may be smaller than the upper limit (UL) and greater than the lower limit (LL). In this case, the controller 900 may determine that the substrate W is in the state suitable to be unloaded, and the second transfer robot 53 may unload the substrate W from the processing space 102 (S24-1).

Figure 9:
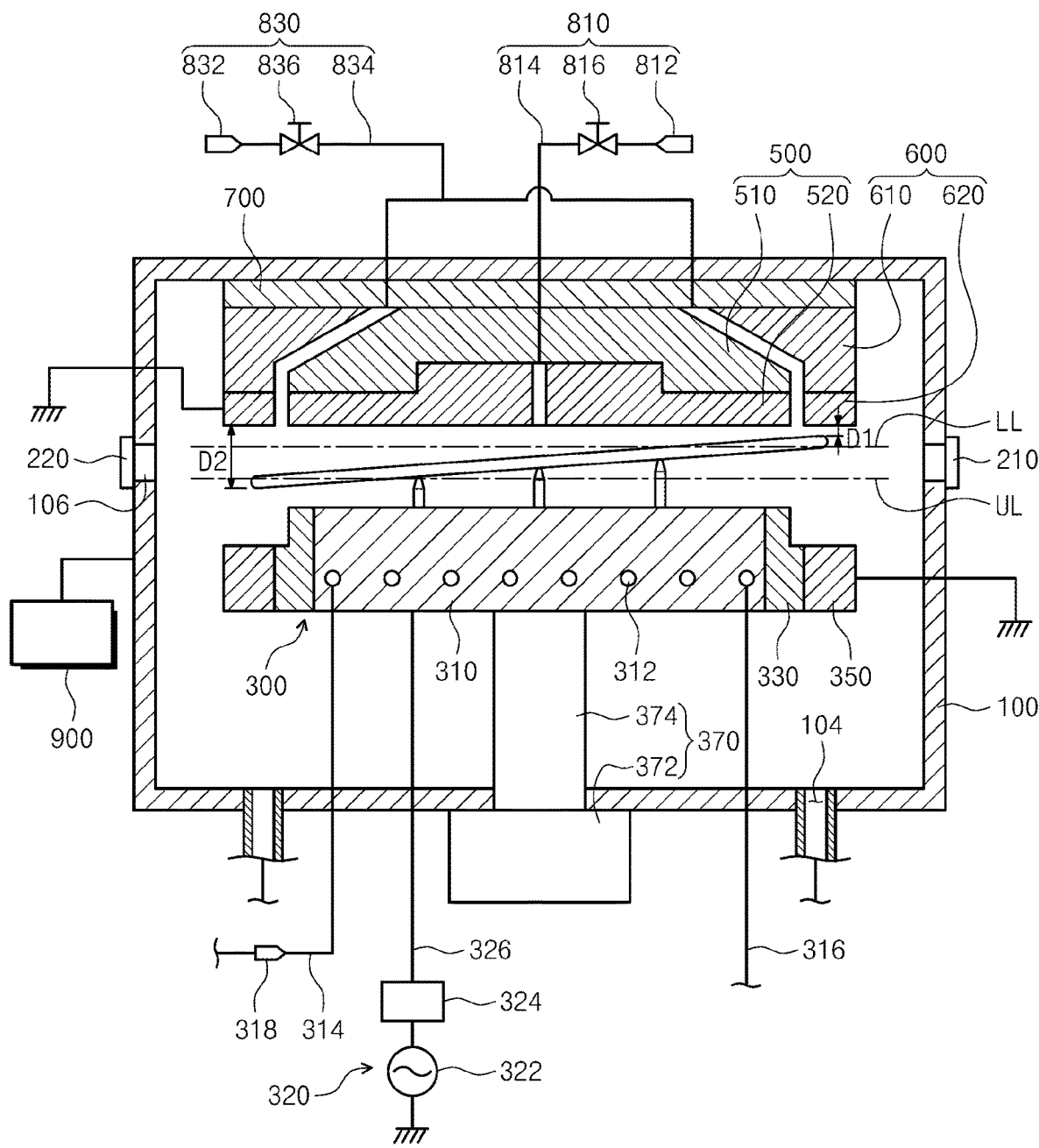
FIG. 9 is a view illustrating the substrate processing apparatus when the substrate placed on the lift pins is in a state unsuitable to be unloaded from the housing.

In contrast, in a case where the substrate W is in a state unsuitable to be unloaded by the second transfer robot 53 as illustrated in FIG. 9, the gaps D1 and D2 measured by the gap measurement unit 200 may be greater than the upper limit (UL) or smaller than the lower limit (LL). For example, the substrate W placed on the lift pins 390 may be in an inclined state for a reason such as wear of the lift pins 390 or damage to the actuator that raises and lowers the lift pins 390. In this case, the gap D1 measured by the gap measurement unit 200 may be smaller than the lower limit (LL). Furthermore, the gap D2 measured by the gap measurement unit 200 may be greater than the upper limit (UL). In this case, the controller 900 determines that the substrate unloading sequence operates even though the substrate W is in a state unsuitable to be unloaded from the processing space 102, and the controller 900 controls the substrate processing apparatus 1000 to generate an interlock and stop the operation of the substrate processing apparatus 1000 (S24-2).

Thereafter, when the substrate W is completely unloaded from the processing space 102 or an interlock is generated, the controller 900 may end the substrate transfer sequence (S25).

A substrate transfer method according to an embodiment of the inventive concept may include moving the lift pins 390 upward and measuring the gap D between the lower surface of the dielectric plate 520 and the upper surface of the chuck 310 or the gap D between the lower surface of the dielectric plate 520 and the upper surface of the substrate W placed on the lift pins 390. In addition, the substrate transfer method may further include determining whether to load the substrate W into the processing space 102 or whether to unload the substrate W from the processing space 102, by comparing the measured gap D with the upper limit (UL) and/or the lower limit (LL). That is, the substrate transfer method according to the embodiment of the inventive concept may include moving the lift pins 390 upward, measuring a gap in a pin-up state by the gap measurement unit 200, and determining whether a substrate W is present in the processing space 102 when another substrate W is loaded and whether the substrate W is raised to an appropriate height when the substrate W is unloaded. Accordingly, the substrate transfer method may minimize collision of the substrate W or a hand of the second transfer robot 53 with components of the substrate processing apparatus 1000. Thus, the substrate W may be efficiently transferred.

In the above-described embodiments, it has been described that the pair of view ports 106 are provided and the irradiation part 210 and the light-receiving part 220 are installed on the view ports 106, respectively. However, the inventive concept is not limited thereto. For example, two pairs of view ports 106 may be provided. Furthermore, a plurality of gap measurement units 200 may be provided. One of the gap measurement units 200 may be installed on one pair of view ports 106, and the other may be installed on the other pair. Furthermore, when viewed from above, the travel path of light irradiated by the irradiation part 210 of one of the gap measurement units 200 may be perpendicular to the travel path of light irradiated by the irradiation part 210 of the other.

According to another embodiment of the inventive concept, the controller 900 may determine whether to load/unload the substrate W, in consideration of all gaps D measured by the plurality of gap measurement units 200. In a case where all of the gaps D measured by the plurality of gap measurement units 200 when the substrate W is loaded are greater than the upper limit (UL), the controller 900 may determine that the substrate W is not present in the processing space 102. In a case where any one of the gaps D measured by the plurality of gap measurement units 200 when the substrate W is loaded is greater than the upper limit (UL), the controller 900 may determine that the substrate W is present in the processing space 102.

In a case where all of the gaps D measured by the plurality of gap measurement units 200 when the substrate W is unloaded are smaller than the upper limit (UL) and greater than the lower limit (LL), the controller 900 may determine that the substrate W is raised to a height suitable to be unloaded. In a case where any one of the gaps D measured by the plurality of gap measurement units 200 when the substrate W is unloaded is smaller than the upper limit (UL) and greater than the lower limit (LL), the controller 900 may determine that the substrate W is raised to a height unsuitable to be unloaded.

That is, according to the other embodiment of the inventive concept, the controller 900 determines whether to load/unload the substrate W, in consideration of all the gaps D measured by the plurality of gap measurement units 200, thereby more assuredly reducing a risk of collision between the second transfer robot 53 and the lift pins 390 or between the second transfer robot 53 and the substrate W when transferring the substrate W.

The above-described substrate processing apparatus 1000 may generate plasma P using an inductively coupled plasma (ICP) method. Alternatively, the above-described substrate processing apparatus 1000 may generate plasma P using a capacitively coupled plasma (CCP) method. In another case, the substrate processing apparatus 1000 may generate plasma P using both the inductively coupled plasma (ICP) method and the capacitively coupled plasma (CCP) method or a selected one of the inductively coupled plasma (ICP) method and the capacitively coupled plasma (CCP) method. In another case, the substrate processing apparatus 1000 may process the edge region of the substrate W using a well-known plasma generation method other than the above-described methods.

As described above, according to the embodiments of the inventive concept, the substrate processing apparatus and the substrate transfer method may efficiently transfer a substrate.

Moreover, according to the embodiments of the inventive concept, the substrate processing apparatus and the substrate transfer method may minimize a risk of collision of the hand of the transfer robot with a substrate and/or the lift pins in a case of loading the substrate into the housing or unloading the substrate from the housing.

Moreover, according to the embodiments of the inventive concept, the substrate processing apparatus and the substrate transfer method may determine the position of a substrate in the housing or a presence or absence of the substrate in the housing in a case of loading the substrate into the housing or unloading the substrate from the housing.

In addition, according to the embodiments of the inventive concept, the substrate processing apparatus and the substrate transfer method may determine whether to load a substrate into the housing or whether to unload the substrate from the housing, based on the position of the substrate in the housing or a presence or absence of the substrate in the housing.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
   a housing having a processing space therein;
   a transfer robot configured to load the substrate into the processing space or unload the substrate from the processing space;
   a support unit including a chuck configured to support the substrate in the processing space and a lift pin configured to move the substrate in an up-down direction;
   a dielectric plate having a lower surface disposed to face an upper surface of the chuck; and
   a gap measurement unit configured to measure a gap between the dielectric plate and the substrate supported by the lift pin or a gap between the dielectric plate and the chuck, wherein the gap measurement unit:
    measures a gap between an upper surface of the substrate and the lower surface of the dielectric plate when the substrate is placed on the lift; and
    measures a gap between the upper surface of the chuck and the lower surface of the dielectric plate when the substrate is not placed on the lift pin.

2. The apparatus of claim 1, wherein the gap measurement unit includes:
    an irradiation part configured to irradiate light; and
    a light-receiving part disposed on a travel path of the light and configured to receive the light.

3. The apparatus of claim 2, wherein the housing includes a pair of view ports configured to face each other,
    wherein the irradiation part is installed on one of the pair of view ports, and
    wherein the light-receiving part is installed on the other view port.

4. The apparatus of claim 2, wherein the gap measurement unit includes a plurality of gap measurement units, and
    wherein when viewed from above, a travel path of light irradiated by an irradiation part of one of the gap measurement units is perpendicular to a travel path of light irradiated by an irradiation part of another one of the gap measurement units.

5. The apparatus of claim 1, wherein the apparatus further comprises a controller, and
    wherein the controller controls the support unit and the gap measurement unit to move the lift pin upward and measure the gap in a state in which the lift pin is moved upward.

6. The apparatus of claim 5, wherein the controller:
    stores an upper limit corresponding to a first gap from the lower surface of the dielectric plate and/or a lower limit corresponding to a second gap from the lower surface of the dielectric plate, the second gap being smaller than the first gap; and
    determines whether to load the substrate into the processing space or whether to unload the substrate from the processing space, by comparing the measured gap with the upper limit and/or the lower limit.

7. The apparatus of claim 6, wherein the controller:
    compares the gap and the upper limit when loading the substrate into the processing space; and
    controls the transfer robot to load the substrate into the processing space when the gap is greater than the upper limit.

8. The apparatus of claim 6, wherein the controller:
    compares the gap and the upper limit when loading the substrate into the processing space; and
    controls the apparatus to generate an interlock when the gap is smaller than the upper limit.

9. The apparatus of claim 6, wherein the controller:
    compares the gap with the upper limit and the lower limit when unloading the substrate from the processing space; and
    controls the transfer robot to unload the substrate from the processing space when the gap is smaller than the upper limit and greater than the lower limit.

10. The apparatus of claim 6, wherein the controller:
    compares the gap with the upper limit and the lower limit when unloading the substrate from the processing space; and
    controls the apparatus to generate an interlock when the gap is greater than the upper limit or smaller than the lower limit.

11. A method for transferring a substrate using the apparatus of claim 1, the method comprising:
    moving the lift pin upward;
    measuring the gap in a state in which the lift pin is moved upward; and
    determining whether to load the substrate into the processing space or whether to unload the substrate from the processing space, based on the measured gap.

12. The method of claim 11, wherein whether to load the substrate into the processing space or whether to unload the substrate from the processing space is determined by comparing the measured gap with an upper limit corresponding to a first gap from the lower surface of the dielectric plate and a lower limit corresponding to a second gap from the lower surface of the dielectric plate, the second gap being smaller than the first gap.

13. The method of claim 12, wherein the gap and the upper limit are compared with each other when the substrate is loaded into the processing space, and
    wherein the substrate is loaded into the processing space when the gap is greater than the upper limit.

14. The method of claim 12, wherein the gap and the upper limit are compared with each other when the substrate is loaded into the processing space, and
    wherein an interlock is generated when the gap is smaller than the upper limit.

15. The method of claim 12, wherein the gap is compared with the upper limit and the lower limit when the substrate is unloaded from the processing space, and
    wherein the substrate is unloaded from the processing space when the gap is smaller than the upper limit and greater than the lower limit.

16. The method of claim 12, wherein the gap is compared with the upper limit and the lower limit when the substrate is unloaded from the processing space, and
    wherein an interlock is generated when the gap is greater than the upper limit and smaller than the lower limit.

* * * * *